United States Patent
Al-Shyoukh et al.

(10) Patent No.: US 7,274,916 B2
(45) Date of Patent: Sep. 25, 2007

(54) DIFFERENTIAL SIGNAL RECEIVER AND METHOD

(75) Inventors: Mohammad A. Al-Shyoukh, Richardson, TX (US); Narasimhan R. Trichy, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 384 days.

(21) Appl. No.: 10/898,272

(22) Filed: Jul. 23, 2004

(65) Prior Publication Data

US 2006/0019619 A1    Jan. 26, 2006

(51) Int. Cl.
*H04B 1/26* (2006.01)
*H04B 1/28* (2006.01)

(52) U.S. Cl. ............ 455/130; 455/142; 455/323; 455/326; 455/333; 327/103

(58) Field of Classification Search ............ 455/74, 455/323–326, 131, 142, 313–319, 333; 327/103
See application file for complete search history.

(56) References Cited

U.S. PATENT DOCUMENTS

| | | | |
|---|---|---|---|
| 4,055,812 A | 10/1977 | Rosenthal | |
| RE29,700 E | 7/1978 | van de Plassche | |
| 5,557,220 A * | 9/1996 | Araya et al. | 327/28 |
| 5,990,737 A * | 11/1999 | Czarnul et al. | 330/69 |
| 6,011,436 A * | 1/2000 | Koike | 330/253 |
| 6,084,471 A * | 7/2000 | Ruth et al. | 330/254 |
| 6,167,284 A * | 12/2000 | Greer | 455/550.1 |
| 6,329,849 B1 * | 12/2001 | Czarnul et al. | 327/103 |
| 6,496,067 B1 * | 12/2002 | Behzad et al. | 330/261 |
| 6,617,925 B2 | 9/2003 | Hoang | |
| 2003/0122623 A1 * | 7/2003 | Maruyama et al. | 330/254 |
| 2004/0043739 A1 | 3/2004 | Jordanger et al. | |
| 2004/0164795 A1 * | 8/2004 | Ueno et al. | 330/69 |

* cited by examiner

*Primary Examiner*—Simon Nguyen
(74) *Attorney, Agent, or Firm*—Alan K. Stewart; W. James Brady; Frederick J. Telecky, Jr.

(57) ABSTRACT

A differential signal receiver and method is disclosed. One embodiment relates to a receiver for receiving a differential signal. The receiver includes a first voltage-to-current converter that converts the voltage received at a first input to a first current, and a second voltage-to-current converter that converts a voltage signal received at a second input to a second current. A current subtractor provides a difference current of the first and second currents that is indicative of the differential signal.

13 Claims, 3 Drawing Sheets

DIFFERENTIAL SIGNAL RECEIVER AND METHOD

TECHNICAL FIELD

The present invention is directed generally to receivers and more specifically to a differential signal receiver and method.

BACKGROUND OF THE INVENTION

Differential signals are frequently employed in high noise environments. A differential receiver can receive a signal on two wires. The signal can be comprised of a common-mode signal with a differential signal superimposed on the common mode signal. Stripping away the common mode signal yields the differential signal. For example, the Controller Area Network (CAN) standard employs a differential signal superimposed on a common mode signal. The CAN standard defines a bus (CAN bus) that is a two-wire, half duplex, high-speed network system that is well suited for high speed applications using short messages. The CAN bus is frequently used in embedded systems having a plurality of microcontrollers.

The current CAN specification is divided into two parts, Standard CAN (version 2.0A) and Extended CAN (version 2.0B). The two versions define different formats of the message frame, with the main difference being the identifier length. Standard CAN uses 11 bit identifiers, while Extended CAN uses 29 bit identifiers. There are two ISO standards for CAN, ISO 11519 and ISO 11898. The difference between the two standards is in the physical layer, where ISO 11519 handles low speed applications up to 125 Kbyte/second and ISO 11898 handles high speed applications up to 1 MB/second.

The CAN bus consists of two wires, a CAN-High (CANH) wire and CAN-Low (CANL) wire. These two wires operate in differential mode as they are carrying inverted differential voltages superimposed on a common-mode signal to decrease noise interference. Currently available CAN transceivers, whether using off-the-shelf components or integrated into an application specific integrated circuits (ASICs), use a voltage based reception of the differential signal on the CAN buses, which is received on the CANH and CANL wires.

The CAN standard imposes a high input common mode voltage range (−30 V to 30 V) that exceeds the typical CAN supply voltage (5V) of CAN receivers. Currently available receivers attenuate both the signal and the common mode range to bring the signal to the 0-5V supply limited common-mode range before the signal gets resolved by the receiver. Attenuating a signal before receiving it is disadvantageous as it degrades the quality of the signal, thus increasing the susceptibility to noise and probability of reception errors.

For example, the CAN standard can employ a differential voltage of 900 mV or greater to indicate a logic "1" state, and a differential voltage of 500 mV or less to indicate a logic "0" state. If the differential voltage is between 500 mV and 900 mV, then similar to a hysteresis effect, the previous logic value is retained. As an example, a signal on CANH can be 30.5 V, while the signal on CANL is 29.5 V, or a signal on CANH can be −29.5 V, while the signal on CANL is −30.5 V (CANH is always greater than CANL) for a differential of one volt, which should be interpreted as a logic "1". Reducing the bus voltage to be within the range of the receivers supply voltage (5V) would also reduce the differential voltage to ⅙ of its original voltage increasing the possibility of errors in interpreting the logic levels associated with the differential signal. Amplifiers can be used to amplify the reduced differential voltage to its original signal level at the receiver, however amplifiers are susceptible to noise and can introduce additional undesirable errors, especially in noisy environments.

SUMMARY OF THE INVENTION

The present invention is directed to a differential signal receiver and method. Accordingly, an aspect of the present invention is directed to a system for receiving a differential signal, wherein the signal comprises a common mode signal and a differential mode signal. The receiver has a first input and a second input for receiving the differential signal. The first input includes a voltage-to-current converter that converts the voltage received at the first input to a first current. The second input includes a voltage-to-current converter that converts a voltage signal received at the second input to a second current. A current subtractor is coupled to the first voltage-to-current converter and the second voltage-to-current converter. The current subtractor subtracts the first current from the second current and provides a difference current that is indicative of the differential signal.

Another aspect of the present invention relates to a Controller Area Network (CAN) compliant receiver. The receiver comprises a means for converting a first portion of a voltage signal to a first current, and a means for converting a second portion of the voltage signal to a second current. The receiver also includes means for subtracting the first current from the second current to provide a difference current corresponding to a differential voltage associated with the first portion and the second portion of the voltage signal.

Another aspect of the present invention relates to a method for receiving a differential voltage signal that is superimposed on a common mode voltage signal that can be well outside the supply range. A first portion of the differential voltage signal is converted to a first current. A second portion of the differential voltage signal is converted to a second current. The first current is subtracted from the second current to produce a difference current indicative of the differential voltage signal.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

The present invention relates to a receiver and method for splitting a differential signal from a common mode signal of a voltage input signal. A first portion (e.g., a high rail) of the voltage input signal is converted into a first current and a second portion of the voltage input signal (e.g., a low rail) is converted into a second current. A difference current is determined by subtracting the second current from the first current. The difference current is indicative of the differential signal with the common mode signal removed. The information (e.g., logic levels) associated with the differential signal can be extracted from the voltage input signal without attenuation of the voltage input signal, thus preserving the quality of the signal during reception.

Figure 1:
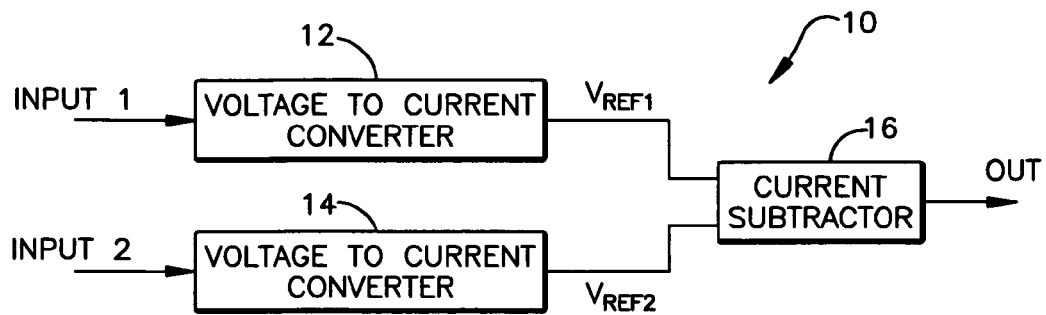
FIG. 1 is a block diagram illustrating a receiver in accordance with an aspect of the present invention.

FIG. 1 is a block diagram illustrating a receiver 10 in accordance with an aspect of the present invention. The receiver 10 receives a voltage input signal that includes a differential input signal superimposed on a common mode signal. A portion (e.g., a high rail) of the voltage input signal is received at INPUT 1, and another portion of the voltage input signal is received at INPUT 2. The voltage received at INPUT 1 is converted to a first current by a voltage-to-current converter 12. The voltage received at INPUT 2 is converted to a second current by voltage-to-current converter 14. The first and second currents are then provided to current subtractor 16. Current subtractor 16 subtracts the first current from the second current and provides the result OUT, which is a difference current of the first and second currents that is indicative of the differential signal with the common mode current subtracted out.

The receiver 10 can be one of a variety of different receiver types that can receive a differential input, such as a Controller Area Network (CAN) compliant receiver. The voltage-to-current converts 12 includes a voltage input, INPUT 1 and a reference voltage node $V_{REF1}$. The voltage-to-current converts 14 includes a voltage input, INPUT 2 and a reference voltage node $V_{REF2}$. A respective resistor can be coupled between the voltage input (e.g. INPUT 1 or INPUT 2) and the reference voltage node (e.g. $V_{REF1}$ or $V_{REF2}$) The resistor produces an input current corresponding to a difference between a voltage at the voltage input and a voltage at the reference voltage node divided by the resistance of the resistor. Optionally, a current source can be coupled to the reference voltage node. The current source can provide a reference current to be combined with the input current. $V_{REF1}$ and $V_{REF2}$ are implemented such that the node is held to $V_{REF1}$, and $V_{REF2}$, respectively, while no current flows into $V_{REF1}$, and $V_{REF2}$.

The resistance of resistor of the first voltage-to-current converter 12 can be selected to be substantially equal to the resistor of the second voltage-to-current converter 14. The reference current provided by the current source of the first voltage-to-current converter 12 can be substantially equal to the reference current provided by the current source of the second voltage-to-current converter 14. Substantially equal means that the actual difference is within the normal tolerance range (e.g., 1%) of the components to produce receiver 10

The reference current used by voltage-to-current converters 12 and 14 can be set to be greater in magnitude than the maximum current. This assures that the current provided by the voltage-to-current converters 12 and 14 is a positive current that is provided to the current subtractor 16 whether the common mode voltage is positive or negative. A voltage regulator can be used by the voltage-to-current converters 12 and 14 for maintaining a fixed voltage at the reference voltage node (e.g. $V_{REF1}$, $V_{REF2}$) Voltage-to-current converters 12 and 14 can also include current sinks coupled to the reference voltage point to receive current flowing through the resistor and current from the current source. Voltage-to-current converters 12 and 14 can use current mirrors adapted to receive the corresponding first and second currents and provide a corresponding first and second mirror currents to the current subtractor 16.

Current subtractor 16 can include a current mirror configured to provide the first current to a node of a circuit with the second current such that the node provides the difference between the first and second currents. A comparator can be coupled to the output of the current subtractor to determine if a difference current corresponds to one of a logic high and a logic low. A current-to-voltage converter can be coupled to the output of current subtractor 16 to convert the difference current to a difference voltage. The difference voltage can be input into a comparator to determine if the difference voltage corresponds to one of a logic high and a logic low.

Figure 2:
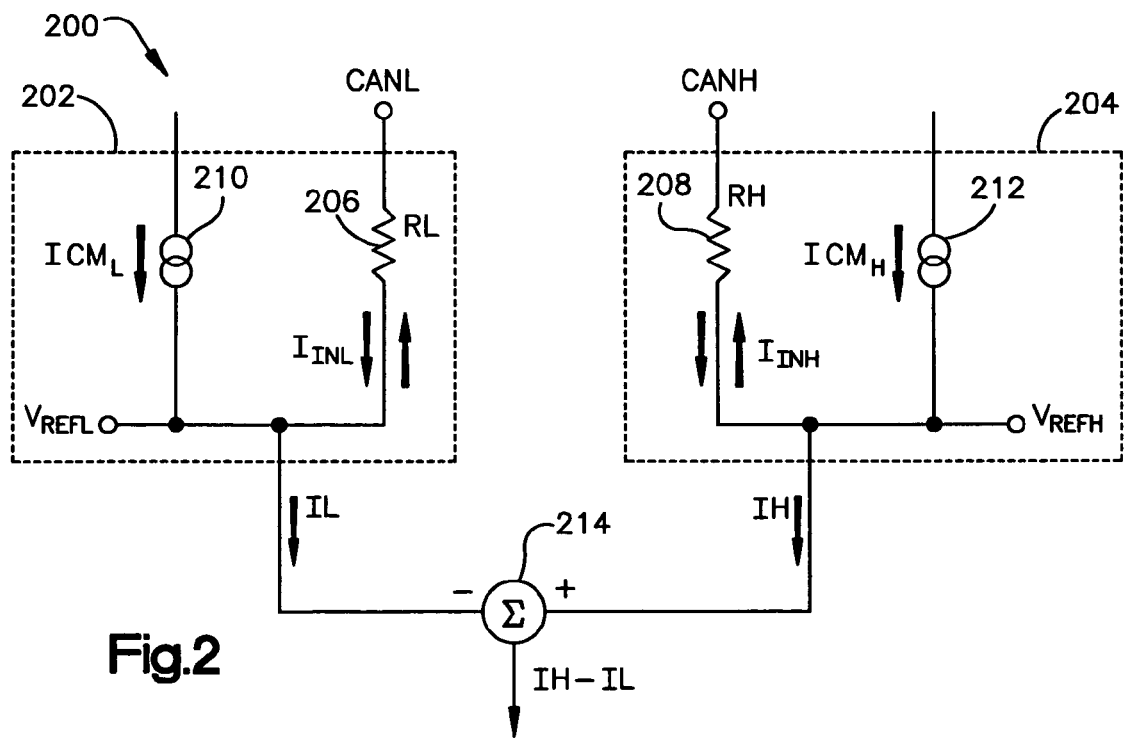
FIG. 2 is a diagram of a portion of a receiver in accordance with an aspect of the present invention.

FIG. 2 is a diagram of a portion of a receiver 200 in accordance with an aspect of the present invention. The receiver 200 has a low rail input (CANL) for receiving a low rail input voltage and a high rail input (CANH) for receiving a high rail input voltage of a differential signal. The low rail input voltage is provided to a first voltage-to-current converter 202, and the high rail input voltage is provided to a second voltage-to-current converter 204. The first voltage-to-current converter 202 is formed of a resistor RL 206, a reference current $ICM_L$, and a reference voltage node $V_{REFL}$. The second voltage-to-current converter 204 is formed of a resistor RH 206, a reference current $ICM_H$, and a reference voltage node $V_{REFH}$. The low rail input (CANL) is coupled to a first end of a resistor RL 206. A second end of the resistor RL 206 is coupled to the reference voltage node $V_{REFL}$. The high rail input (CANH) is coupled to a first end of a resistor RH 208. A second end of the resistor RH 208 is coupled to the reference voltage node $V_{REFH}$.

A low rail input current $I_{INL}$ flows through RL 206 that is the difference in voltage between the low rail input voltage and $V_{REFL}$ divided by the value of RL 206. The reference current $ICM_L$ is selected to be higher than the low rail input current $I_{INL}$, such that a positive current IL flows from the reference voltage node $V_{REFL}$. For example, the low rail input current $I_{INL}$ is positive and flows in the direction of the reference voltage node $V_{REFL}$ if the low rail input voltage is positive (e.g., +29.5V to +30V). The lower rail input current $I_{INL}$ is negative and flows in the direction of the low rail input (CANL) if the low rail input voltage is negative (e.g., −30V to −30.5V)) A current source 210 provides the common mode or reference current $ICM_L$ to node $V_{REFL}$. The current IL from node $V_{REFL}$ to summer 214 is positive and substantially equal to the common mode current $ICM_L$ plus the low rail input current (e.g., $I_{INL}$, $-I_{INL}$). The current IL corresponds to the low rail input voltage. It is to be appreciated that substantially no current bleeds to the reference voltage source from the reference voltage node $V_{REFL}$.

A high rail input current $I_{INH}$ flows through RH 208 that is the difference in voltage between the high rail input current and $V_{REFH}$ divided by the value of RH 208. The reference current $ICM_H$ is selected to be higher than the high rail input current $I_{INH}$, such that a positive current IH flows from the reference voltage node $V_{REFH}$. For example, the high rail input current $I_{INH}$ is positive and flows in the direction of the reference voltage node $V_{REFH}$ if the high rail input voltage is positive (e.g., +30V to +30.5V). The high rail input current $I_{INH}$ is negative and flows in the direction of the high rail input if the high rail input voltage is negative (e.g., −29.5V to −30V)) A current source 212 provides a common mode or reference current $ICM_H$ to node $V_{REFH}$. The current IH from node $V_{REFH}$ to summer 214 is positive and substantially equal to the common mode current $ICM_H$ plus the high rail input current (e.g., $I_{INH}$, $-I_{INH}$). The current IH corresponds to the high rail input voltage. It is to be appreciated that substantially no current bleeds to the reference voltage source from the reference voltage node $V_{REFH}$.

The summer 214 receives the current IL from reference voltage node $V_{REFL}$ and the current IH from reference voltage node $V_{REFH}$. Summer 214 produces an output IH–IL that is the difference between IL and the IH and indicative of the voltage level of the differential input signal (CANH, CANL), such that the voltage associated with the common mode voltage is substantially removed.

In one aspect of the invention, substantially identical resistances for RL and RH are employed, and substantially identical currents are provided by current sources 210 and 212 to simplify the interpretation of the results of summer 214. For example, setting R=RH=RL, ICM=$ICM_H$=$ICM_L$, and $V_{REF}$=$V_{REFH}$=$V_{REFL}$, yields the following:

$$IL=(VCANL-V_{REF})/R+ICM \quad \text{EQ. 1}$$

$$IH=(VCANH-V_{REF})/R+ICM \quad \text{EQ. 2}$$

$$IH-IL=((VCANH-V_{REF})/R+ICM)-((VCANL-V_{REF})/R-ICM), \text{ or} \quad \text{EQ. 3}$$

$$IH-IL=(VCANH-VCANL)/R \quad \text{EQ. 4}$$

such that EQ. 4 is indicative of the difference between the voltage at the low rail input (VCANL) and the high rail input (VCANH) without attenuating the voltages at the low rail input and the high rail input.

Figure 3:
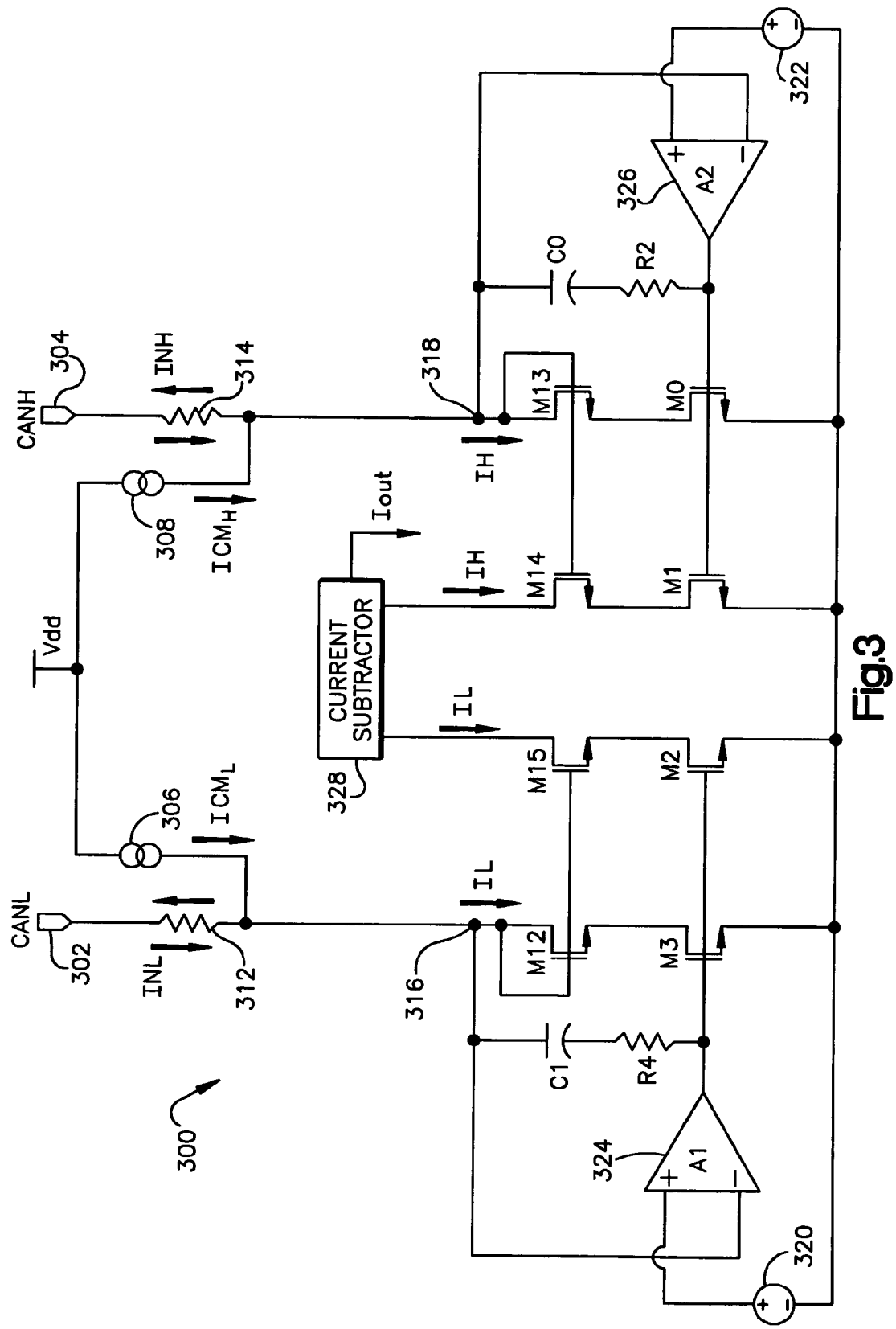
FIG. 3 is a circuit diagram of a portion of an exemplary receiver in accordance with an aspect of the present invention.

Referring to FIG. 3, there is illustrated a circuit diagram of a portion of an exemplary receiver 300 in accordance with an aspect of the present invention. A low rail input 302 (CANL) and a high rail input 304 (CANH) receive a signal from a CAN bus. The signal comprises a common mode signal and a differential signal. The common mode signal is received on both the low rail input 302 and the high rail input 304. A portion of the differential signal is received at the low rail input 302 and another portion of the differential signal is received at the high rail input 304.

A low rail voltage signal is applied to resistor 312 that has its opposing end coupled to a node 316. The node 316 is maintained at a substantially constant voltage. A current source 306 provides a common mode or reference current $ICM_L$ to node 316. The reference current $ICM_L$ provided by source 306 can be selected such that a current IL flows in one direction through transistors M12 and M3 regardless of the polarity of the voltage applied at the low rail input 302. This can be accomplished by selecting a current $ICM_L$ that is greater than the current $I_{INL}$ that can flow through resistor 314.

The voltage at node 316 is maintained by an operational amplifier 324. One input of operational amplifier input is connected to the node 316, while the other input is connected to a voltage source 320. Assuming an ideal operational amplifier, the voltage produced by voltage source 320 would appear at the opposing input of operational amplifier 324, which would also appear at the node 316. The voltage produced by voltage source 320 should be within 20-80% of the supply voltage. For example, for a supply voltage of 5 volts, the voltage source should be in the range from 1 to 4 volts. This range can vary depending on the technology used to fabricate the circuit. Resistor R3 and capacitor C1 in the feedback path of operational amplifier 324 are selected to provide stability and prevent the circuit from oscillating.

The current IL flowing through M12 and M3 is mirrored to M15 and M2. The current IL is proportional to the input voltage at the low rail input 302. Transistors M12 and M3 function as a controllable switching device that is biased by the current source 306, so that the controllable switching device only conducts in one direction. The mirrored current IL is coupled to a first terminal of a current subtractor 328.

A high rail voltage signal is applied to resistor 314 that has its opposing end coupled to a node 318. The node 318 is maintained at a substantially constant voltage. A current source 308 provides a common mode or reference current $ICM_H$ to node 318. The reference current $ICM_H$ provided by source 308 can be selected to such that a current IH flows in one direction through transistors M13 and M0 regardless of the polarity of the voltage applied at the high rail input 304. Transistors M13 and M0 function as a controllable switching device that is biased by the current source 308, so that the controllable switching device only conducts in one direction. This can be accomplished by selecting a current $ICM_H$ that is greater than a current $I_{INH}$ that can flow through resistor 312.

The voltage at node 318 is maintained by an operational amplifier 326. One input of operational amplifier input is connected to the node 318, while the other input is connected to a voltage source 322. Assuming an ideal operational amplifier, the voltage produced by voltage source 322 would appear at the opposing input of operational amplifier 326, which would also appear at the node 318. The voltage produced by voltage source 322 should be within 20-80% of the supply voltage. For example, for a supply voltage of 5 volts, the voltage source should be in the range from 1 to 4 volts. This range can vary depending on the technology used to fabricate the circuit. Resistor R2 and capacitor C0 in the feedback path of operational amplifier 326 are selected to provide stability and prevent the circuit from oscillating. The current IH flowing through M13 and M0 is mirrored to M14 and M1. The current IH is proportional to the input voltage at the high rail input 304. The mirrored current IH is coupled to a second terminal of the current subtractor 328.

The current subtractor 328 generates an output current Iout by subtracting the current IL from the current IH. The output current Iout (IH–IL) is a difference current that is indicative of the differential voltage signal at the low rail input 302 and the high rail input 304 with the common mode voltage removed.

The components of receiver 300 can be selected so that IH and IL are properly scaled and no further manipulation of the result Iout from current subtractor 328 is necessary. This can be accomplished by selecting similar reference current ($ICM_H$, $ICM_L$) values, similar resistor (312, 314) values and similar reference voltages (320, 322) for both the high rail input and the low rail input.

Figure 4:
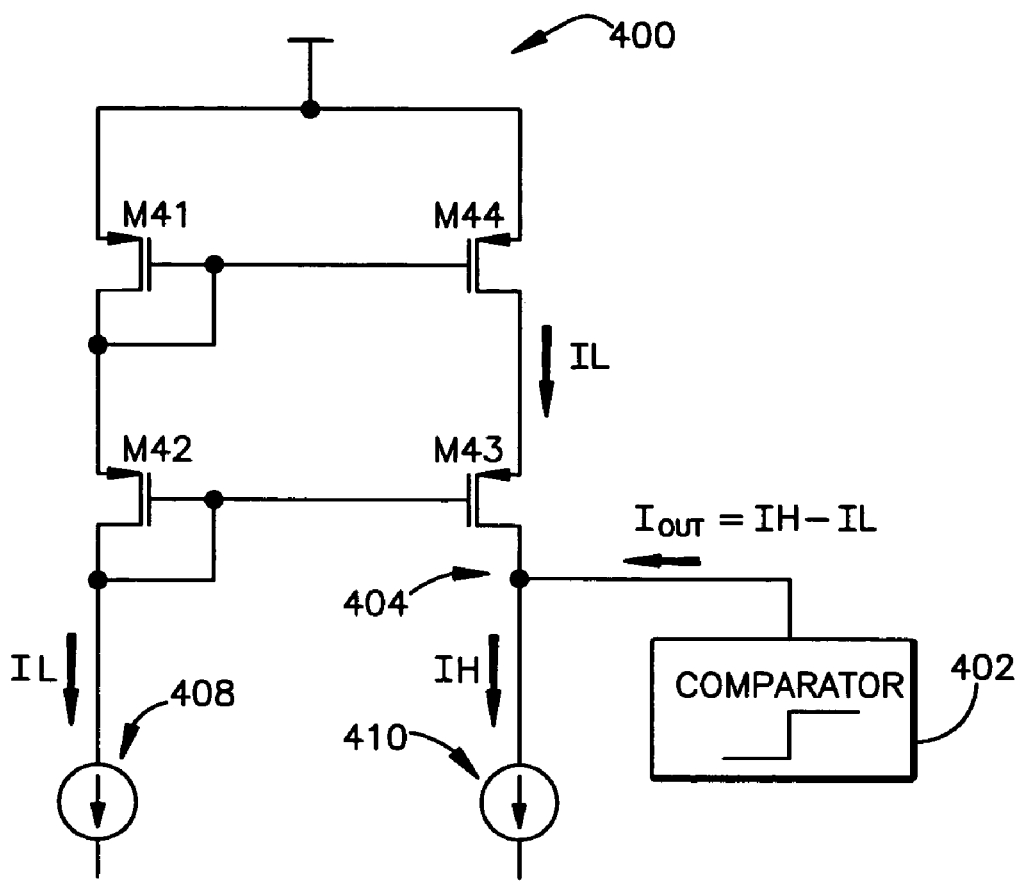
FIG. 4 is a circuit diagram of an exemplary current subtractor circuit in accordance with an aspect of the present invention.

FIG. 4 is a circuit diagram illustrating an exemplary current subtractor circuit 400 in accordance with an aspect of the present invention. The current subtractor 400 includes transistors M41, M42, M43, and M44. A current sink 408 sinks current IL, such that the current IL flows through transistors M41 and M42. Transistors M41 and M42 are configured to mirror current IL through transistors M44 and M43, such that the current IL flows into a node 404. Additionally, a current sink 410 sinks current IH flowing out of node 404. Therefore, a current Iout flows out of the node that is substantially equal to the difference between IH and IL. Iout is provided to a comparator 402. The comparator 402 can compare Iout to a reference current to determine a logic state of the signal associated with Iout. Alternatively, the comparator can convert Iout into a voltage level which can be compared with a reference voltage to determine a logic state of the signal associated with Iout.

Figure 5:
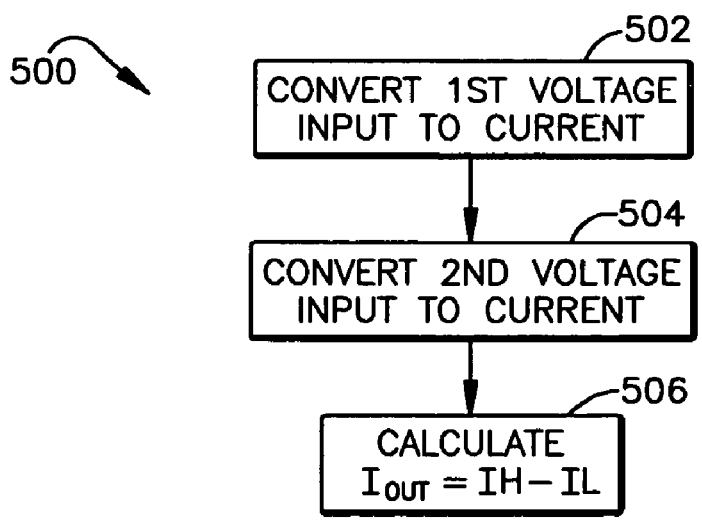
FIG. 5 is a block diagram of a method in accordance with an aspect of the present invention.

In view of the examples shown and described above, a methodology for receiving a differential signal in accordance with the present invention will be better appreciated with reference to FIG. 5. While, for purposes of simplicity of explanation, a methodology is shown and described as executing serially, it is to be understood and appreciated that the methodology is not limited by the order shown, as some aspects may, in accordance with the present invention, occur in different orders and/or concurrently from that shown and described herein. Moreover, not all features shown or described may be needed to implement a methodology in accordance with the present invention. Additionally, such methodology can be implemented in hardware (e.g., one or more integrated circuits), software (e.g., running on a DSP or ASIC) or a combination of hardware and software.

FIG. 5 is a block diagram of a method 500 in accordance with an aspect of the present invention. The methodology begins at 502 in which a first portion of a differential voltage signal superimposed on a common mode signal is converted to a first current. This conversion of the first portion of the differential signal can be performed by a voltage-to-current converter. At 504, the second portion of the differential voltage signal is converted to a second current, which can also be performed by a voltage-to-current converter. A differential voltage signal can be superimposed on a common mode voltage signal, and the differential voltage signal comprises a first portion or low rail voltage input signal and a second portion or high rail input voltage signal. For example, a CAN receiver receives a differential voltage signal superimposed on a common mode signal, where the first portion of the differential signal is received on the CANL line, and the second portion of the differential signal is received on the CANH line.

The first portion of the differential voltage signal can be converted to the first current by applying the first portion of the differential voltage signal to a first resistor that is coupled to a fixed reference voltage at a first node to produce a first input current. Optionally, a first reference current from a current source can also be coupled to the first node and added to the first input current to form the first current. The second portion of the differential signal can be converted to the second current by applying the second portion of the differential voltage signal to a second resistor that is coupled to a fixed reference voltage at a second node to produce a second input current. Optionally, a second reference current from a second current source can also be coupled to the second node and added to the first input current to form the second current.

At 506, the first current is subtracted from the second current to produce a difference current indicative of the differential voltage signal. The subtraction can be performed by a current subtractor. A common mode current associated wit the common mode voltage is removed when the first current is subtracted from the second current.

The difference current can be provided to a comparator to provide a digital signal indicative of the logic states associated with the received differential signal. Alternatively, the difference current can be converted to a difference voltage (e.g., by passing the difference current through a resistor) and the difference voltage can be compared with a fixed reference voltage to determine the logic states associated with the received differential signal.

What has been described above includes examples and implementations of the present invention. Because it is not possible to describe every conceivable combination of components, circuitry or methodologies for purposes of describing the present invention, one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A receiver for receiving a signal comprising a common mode signal and a differential signal, the receiver comprising:
   a first voltage-to-current converter that converts a first voltage input of the signal to a first current;
   a second voltage-to-current converter that converts a second voltage input of the signal to a second current; and
   a current subtractor that provides a difference current of the first and second currents that is indicative of the differential signal;
   wherein each of the first and second voltage-to-current converters comprise:
   a voltage input;
   a reference voltage node;
   a resistor coupled between the voltage input and the reference voltage node, that produces an input current corresponding to a difference between a voltage at the voltage input and a voltage at the reference voltage node divided by the resistance of the resistor; and
   a current source coupled to the reference voltage node, the current source providing a reference current to be combined with the input current.

2. The receiver as in claim 1, wherein the receiver is a Controller Area Network (CAN) compliant receiver.

3. The receiver as claimed in claim 1, wherein the resistance of resistor of the first voltage-to-current converter is substantially equal to the resistance of the second voltage-to-current converter.

4. The receiver as claimed in claim 1, wherein the reference current provided by the current source of the first voltage-to-current converter is substantially equal to the reference current provided by the current source of the second voltage-to-current converter.

5. The receiver as claimed in claim 1, wherein the reference current is greater in magnitude than the input current, such that a positive current is provided the current subtractor for both a positive input voltage and a negative input voltage to the first and second voltage inputs.

6. The receiver as claimed in claim 5, further comprising a voltage regulator for maintaining a fixed voltage at the reference voltage node.

7. The receiver as claimed in claim 6, wherein the voltage regulator comprising an operational amplifier having first and second inputs, wherein the first input is connected to the reference voltage node and the second input is connected to a voltage source.

8. The receiver as claimed in claim 7, each voltage-to-current converter further comprising a controllable switching device coupled to the reference voltage point to receive current flowing through the resistor and current from the current source, wherein the current source is configured to bias the controllable switching device so that the controllable switching device conducts in only one direction.

9. The receiver as claimed in claim 8, each voltage-to-current converter further comprising a current mirror coupled to receive current from the controllable switching device and provide a mirrored current to the current subtractor.

10. The receiver as claimed in claim 1, wherein each of the first and second voltage-to-current converters further comprise a current mirror adapted to receive the correspond ing first and second current and provide a corresponding first and second mirror currents to the current subtractor.

11. The receiver as claimed in claim 1, the current subtractor further comprises a current mirror configured to provide the first current to a node of a circuit with the second current such that the node provides the difference between the first and second currents.

12. The receiver of claim 1, further comprising a comparator coupled to the output of the current subtractor to determine if the difference current corresponds to one of a logic high and a logic low.

13. The receiver of claim 12, further comprising a current-to-voltage converter coupled to the output of the current subtractor to provide a difference voltage that corresponds to the difference current.

* * * * *